United States Patent
Martin et al.

(10) Patent No.: US 11,121,289 B2
(45) Date of Patent: Sep. 14, 2021

(54) ULTRA-DENSE QUANTUM DOT COLOR CONVERTERS

(71) Applicant: TECTUS CORPORATION, Saratoga, CA (US)

(72) Inventors: Paul Martin, Palo Alto, CA (US); Lucymarie Mantese, Palo Alto, CA (US); Gregory David Miller, Palo Alto, CA (US); William Freeman, Palo Alto, CA (US)

(73) Assignee: Tectus Corporation, Saratoga, CA (US)

( * ) Notice: Subject to any disclaimer, the term of this patent is extended or adjusted under 35 U.S.C. 154(b) by 42 days.

(21) Appl. No.: 16/689,202

(22) Filed: Nov. 20, 2019

(65) Prior Publication Data

US 2021/0151637 A1 May 20, 2021

(51) Int. Cl.
*H01L 33/50* (2010.01)
*G02C 7/04* (2006.01)
*H01L 27/15* (2006.01)
*H01L 33/06* (2010.01)

(52) U.S. Cl.
CPC ............. *H01L 33/502* (2013.01); *G02C 7/04* (2013.01); *H01L 27/156* (2013.01); *H01L 33/06* (2013.01)

(58) Field of Classification Search
CPC ............ H01L 27/146; H01L 27/14601; H01L 27/14643; H01L 27/14683; H01L 27/15; H01L 27/153; H01L 27/156; H01L 33/04; H01L 33/06; H01L 33/08; H01L 33/26; H01L 33/44; H01L 33/48; H01L 33/50; H01L 33/501; H01L 33/502; H01L 33/505; H01L 33/507; H01L 33/508; H01L 33/58; H01L 33/60; H01L 51/50; H01L 51/52; H01L 27/322; G02F 1/1336; G02F 1/133603; G02F 1/133606; G02F 1/133614; G02F 1/133621
See application file for complete search history.

(56) References Cited

U.S. PATENT DOCUMENTS

| | | | |
|---|---|---|---|
| 8,349,116 | B1 | 1/2013 | Bibl |
| 2013/0056705 | A1 | 3/2013 | Kim |
| 2017/0153366 | A1 | 6/2017 | Park |
| 2017/0219753 | A1 | 8/2017 | Amano |
| 2017/0271605 | A1 | 9/2017 | Steckel |
| 2017/0277002 | A1 | 9/2017 | Yamada |
| 2018/0006092 | A1 | 1/2018 | Rieger |
| 2018/0083156 | A1 | 3/2018 | Mezouari |

(Continued)

FOREIGN PATENT DOCUMENTS

| | | |
|---|---|---|
| WO | 2009098793 A1 | 8/2009 |
| WO | 2014129067 A1 | 8/2014 |

(Continued)

OTHER PUBLICATIONS

Clapp et al., "Fluorescence Resonance Energy Transfer Between Quantum Dot Donors and Dye-Labeled Protein Acceptors," J. Am. Chem. Soc, 2004, vol. 126, p. 301-310.

(Continued)

*Primary Examiner* — Cheung Lee

(57) ABSTRACT

Quantum dot-based color converters having a high density of sub-pixels. The sub-pixels have a high density of quantum dots that provide for high conversion efficiency within small sub-pixel aspect ratios and small volumes. The color converter can be used in optical displays.

31 Claims, 10 Drawing Sheets

(56) References Cited

U.S. PATENT DOCUMENTS

| | | |
|---|---|---|
| 2018/0088261 A1 | 3/2018 | Song |
| 2018/0108303 A1 | 4/2018 | Park |
| 2018/0261736 A1 | 9/2018 | Bonar |
| 2019/0112523 A1 | 4/2019 | Kim |

FOREIGN PATENT DOCUMENTS

| | | |
|---|---|---|
| WO | 2017007770 A2 | 1/2017 |
| WO | 2019079381 A1 | 4/2019 |

OTHER PUBLICATIONS

Shen et al., "Purification of Quantum Dot by Gel Permeation Chromatography and the Effect of Excess Ligands on Shell Growth and Ligand Exchange," Chemistry of Materials, 2013, vol. 25, p. 2838-2848.

International search report and written opinion for PCT/US2020/060469, dated Mar. 4, 2021. 17 pages.

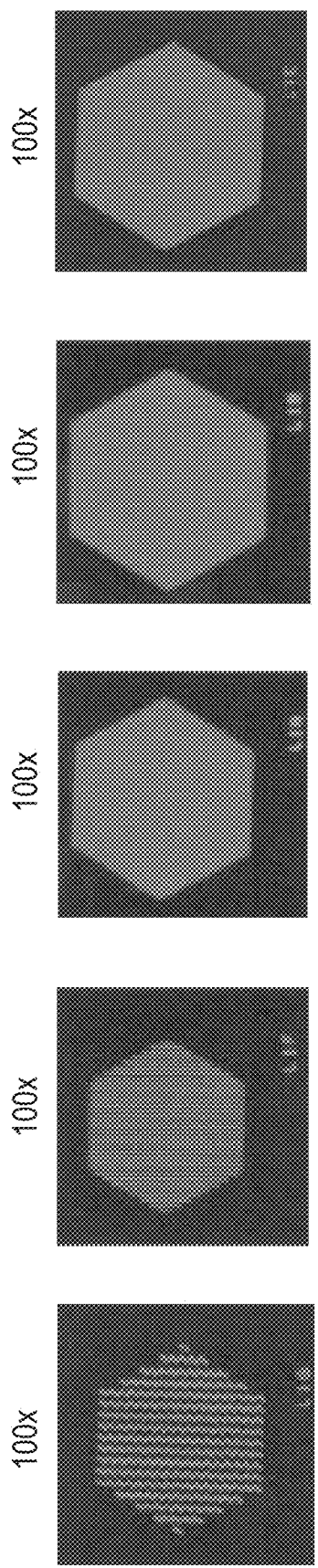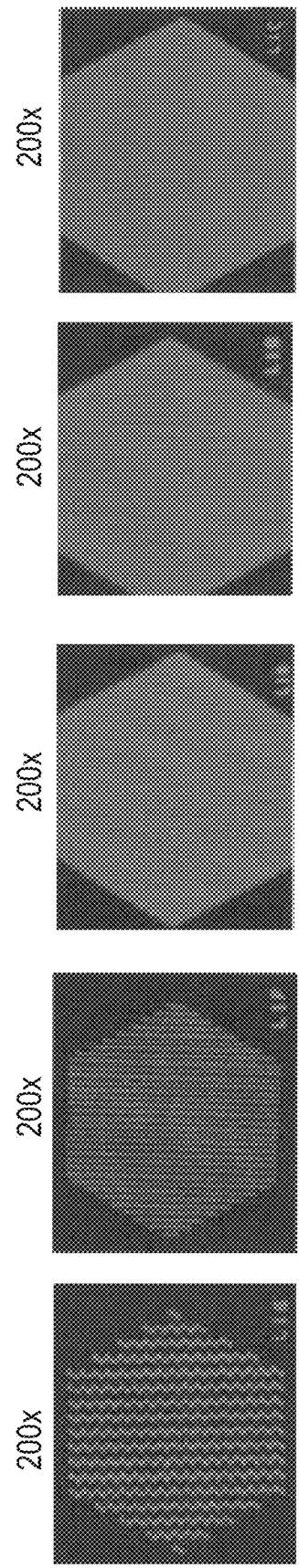

ULTRA-DENSE QUANTUM DOT COLOR CONVERTERS

FIELD

The disclosure relates to quantum dot color converters having a high density of pixels. The pixels have a high density of quantum dots. The color converter can be used in optical displays.

BACKGROUND

Arrays of quantum-dot containing pixels irradiated with LEDs are widely used in displays. Reducing the size of quantum dot-containing pixel arrays for use in applications such as integrated contact lens displays presents unique challenges.

BRIEF DESCRIPTION OF THE DRAWINGS

The drawings described herein are for illustration purposes only. The drawings are not intended to limit the scope of the present disclosure.

FIG. 3A-3J show transmitted blue light through an array of sub-pixels having different diameters and on different pitches.

DETAILED DESCRIPTION

Figure 1:
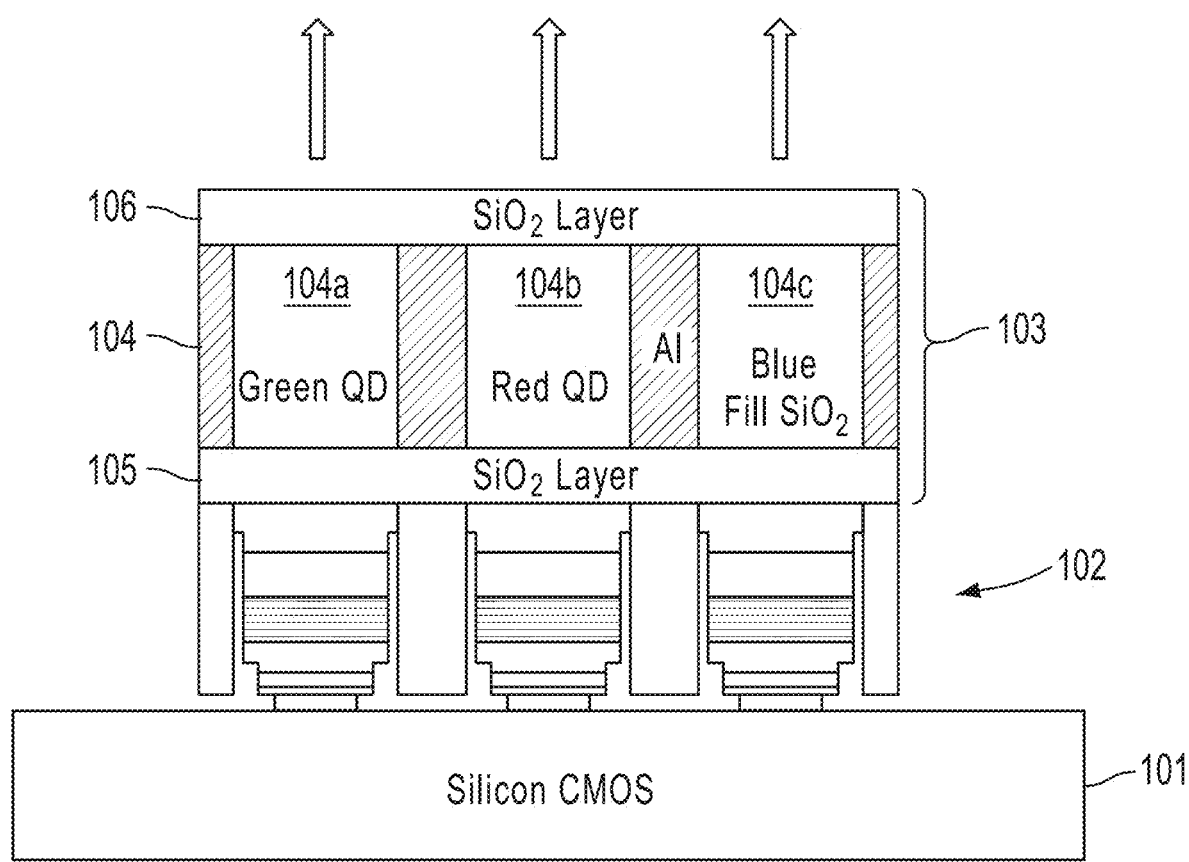
FIG. 1 shows an example of green, red, and blue sub-pixels provided by the present disclosure.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements, person-to-person variations, and/or day-to-day variations.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

"Color converter" refers to a structure configured to convert the wavelength of incident radiation such as light from an array of blue-emitting light emitting diodes (LED) to emitting light within one or more different wavelength ranges such as, for example, light within the green and red wavelength ranges. A color converter comprises a plurality of pixels and can comprise multiple layers including a color conversion layer comprising the plurality of sub-pixels and one or more other layers such as passivation layers, reflective layers, cross-talk minimizing layers, and/or focusing layers.

"Color conversion element" refers to a volume comprising a plurality of quantum dots. For example, a color conversion element can comprise a plurality of quantum dots capable of converting blue light into red light and/or green light.

"Red wavelength range" refers to refers to a wavelength range from 565 nm to 650 nm.

"Far red wavelength range" refers to a wavelength range from 650 nm to 750 nm.

"Green wavelength range" refers to a wavelength range from 515 nm to 565 nm.

"Blue wavelength range" refers to a wavelength range from 405 nm to 475 nm.

"Sub-pixel" refers to an individually addressable element of a display device. A sub-pixel can comprise a color conversion element and optionally one or more material layers underlying the color conversion element and/or one or more material layers overlying the color conversion elements. The one or more underlying and/or overlying material layers can serve one or more functions. For example, an underlying layer can serve as a substrate, a wavelength-selective filter, or a layer designed to minimize cross-talk between pixels and sub-pixels. An overlying material layer can serve, for example, as a passivation layer, a wavelength-selective filter, or as a lens.

Pixel" refers to a group of sub-pixels which is repeated across a display. For example, a pixel can comprise from 2 to 6, such as 2, 3, 4, 5, or 6 sub-pixels. A pixel can comprise, for example, a red sub-pixel, a green sub-pixel, and a blue sub-pixel. Other color combinations are also possible.

Quantum dot-containing sub-pixels are widely used in displays.

For certain applications it can be desirable that an ultra-dense quantum dot full-color converter be less than 2 µm thick with sub-pixels at a pitch less than 2 µm. Fabricating quantum dot sub-pixels having a high overall conversion efficiency on these dimensions and integrating an ultra-dense quantum dot color converter into a robust, miniaturized optical display entails the use of specialized materials and processing.

An optical display can comprise a quantum dot color converter overlying an LED array. The color converter can comprise an array of sub-pixels. Certain of the sub-pixels can comprise quantum dots capable of converting incident light within a first wavelength range to emitted light within in second wavelength range. For example, in the context of a display, incident blue light can be converted to emitted light in the red wavelength range, other sub-pixels can comprise quantum dots capable of emitting in the green wavelength range when irradiated with light in the blue wavelength range, and other sub-pixels are transparent to light in the blue wavelength range. Each of the sub-pixels can be aligned with a corresponding blue-emitting LED of an LED array.

Figure 9:
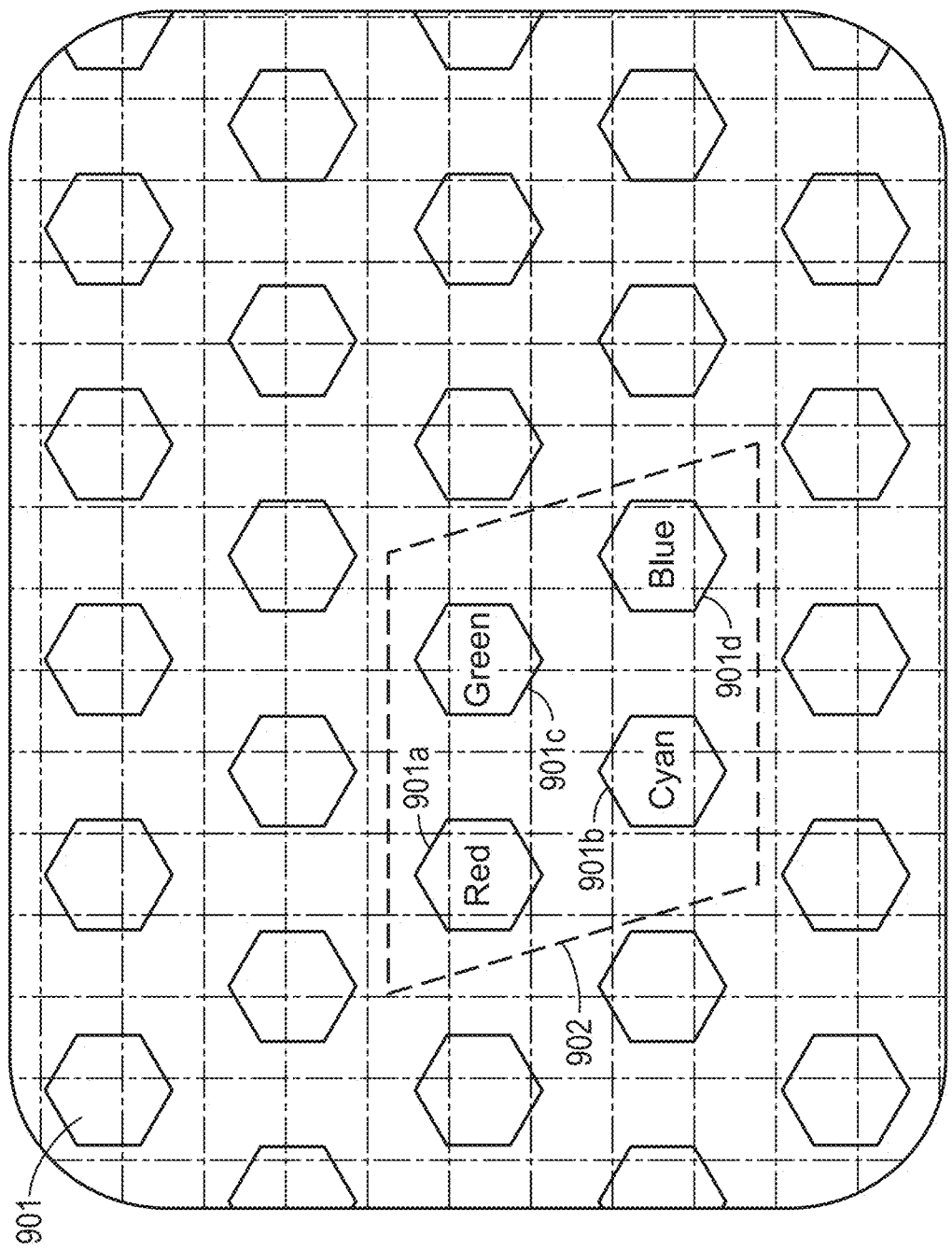
FIG. 9 shows an array of sub-pixels and a pixel comprising different colored sub-pixels.

Ultra-dense optical displays such as optical displays having a sub-pixel pitch less than 5 µm, can be useful in portable electronic devices and in contact lens arrays. Contact lenses incorporating optical displays are described, for example, in U.S. Application Publication No. 2018/0149884. Ultra-dense optical displays and in particular optical displays for contact lenses present unique design requirements. It is well known that displays "look sharp" at pixel densities in excess of one pixel per arc second (Snellen 20/20). Snellen 20/20 is not "perfect" human vision, but is near average for adults in their 60's. Young adults with no visual impairment have visual acuity between 20/16 and 20/12. Snellen 20/12 corresponds to 100 pixels/degree and puts further constraints on the pixel size. Because angular resolution is defined in terms of pixels/degree, the closer a display is to the eye, the higher the display pixel PPI (pixels per linear inch) must be to achieve a desired Snellen angular resolution. A QLED television has a pixel pitch of about 150 µm to accommodate a viewing distance of about 2 meters, and the thickness of the quantum dot-containing color conversion film is about 15 µm. A cellular phone has pixel pitch of about 55 µm to accommodate a viewing distance of about 0.3 meters. A display on a headset viewed from a distance of about 0.04 meters can have a pixel pitch of about 9 µm. A display on a contact lens, which is about 25 mm from the retina, should have a pixel pitch of about 1.8 µm to meet a 60 pixel/degree metric for 20/20 vision over a field of view of about 5 degrees with a 3× magnification from a contact lens display to a retinal image. An example of a pixel containing four sub-pixels is shown in FIG. 9.

The increased PPI and pixel pitch can impact the requirements of a color conversion layer. Color conversion efficiency, defined as the number of color-converted photons in the red, green or other wavelength range emitted from a specific color converted sub-pixel divided by the number of pump photons, such as blue or ultraviolet photons, impinging on the color conversion layer is dependent on the distance between the quantum dots and the material separating the quantum dots. A small number of pump photons may exit the display desaturating the color purity. Color conversion purity is a measure of the purity of the light exiting a specific color-converted sub-pixel and is defined as the number of color-converted photons divided by the total number of photons including both color-converted photons and pump photons exiting a specific color converted sub-pixel. For example, for a red color converted sub-pixel color conversion purity is defined as the number of red photons exiting the red sub-pixel divided by the sum of the number of red photons plus the number of pump photons, such as blue photons, existing the same red sub-pixel. An increase toward 100% are desirable for both color conversion efficiency and color conversion purity and both metrics become more difficult as pixel size and thickness are reduced. Color conversion purity is a strong function of the optical properties of the specific quantum dots and the density of the quantum dots within the color conversion film. As the width of a pixel decreases from that of a QLED television display with a sub-pixel size of about 75 µm to less than about 2 µm for an ultra-dense contact lens display, it becomes impractical to maintain a 15 µm-thick quantum dot-containing sub-pixel because fabricating quantum dot-containing sub-pixels having a high aspect ratio presents challenges. Furthermore, in certain applications such as contact lens displays, it is desirable to have the display be as thin as possible. To meet the objectives of practical fabrication and thin displays, it can be desirable that the sub-pixel height be 2 µm or less. Then, to maintain an acceptable color conversion efficiency greater than about 50% and an acceptable color conversion purity of greater than about 80% the density of the quantum dots within the high aspect-ratio sub-pixel must be increased. However, the practical density of quantum dots can be limited by Forster resonance energy transfer between adjacent quantum dots, which to mitigate the effects of Forster resonance energy transfer (FRET) requires that adjacent quantum dots be uniformly spaced apart by from about 5 nm to about 10 nm. Energy transfer to other sub-pixel elements such as metal sidewalls can also reduce efficiency. Color converters having a total thickness less than about 10 µm and a color conversion layer comprising a plurality of sub-pixels having a pitch less than about 2 µm and a sub-pixel width less than about 2 µm are provided by the present disclosure.

The challenges of creating an ultra-dense color converter include providing a coating on a quantum dot that allows for dense quantum dot packing and minimizes FRET, developing structures and processes that can provide RGB (red/green/blue) sub-pixels with a PPI greater than 10,000 on a pitch less than 5 µm (6.4 µm pitch is about 3,900 PPI, and a 1.3 µm pitch is about 19,500 PPI), and providing an accurate color gamut with an acceptable dark level and low inter-sub-pixel cross-talk.

Color converters provided by the present disclosure can comprise multiple layers including a color conversion layer. For example, a color converter can comprise a substrate layer, a color conversion layer overlying the substrate layer, a passivation layer overlying the color conversion layer, and optionally additional layers such as reflective layers and lens layers.

A color conversion layer can comprise a plurality of sub-pixels, with at least some of the sub-pixels comprising a plurality of quantum dots.

A volume fraction of quantum dots within a pixel can be from 10% to 70%, from 10% to 50%, such as from 10% to 40%, from 10% to 30%, or from 10% to 20%.

A color conversion layer can have a thickness, for example, less than 20 µm, less than 15 µm, less than 10 µm, or less than 5 µm.

A color conversion layer comprising the plurality of sub-pixels can have an area, for example, from 0.2 mm² to 10 mm².

A color conversion layer can have a linear dimension, for example, from 0.2 mm to 1.5 mm.

An example of a color conversion layer is shown in FIG. 1. FIG. 1 shows a silicon CMOS circuit 101 interconnected to an overlying LED array 102. A color conversion layer 103 consisting of a layer comprising a plurality of sub-pixels 104, and an underlying passivation layer 105 and an overlying passivation layer 106 passivation layers. Individual LEDs are aligned with individual sub-pixels. The pixel layer 104 includes green 104a and red 104b sub-pixels comprising a plurality of green and red quantum dots, respectively, and further includes a blue sub-pixel 104c configured to transmit light in the blue wavelength range as emitted by the LED array 102. The color conversion layer 103 can be, for example, 2 µm thick.

A color conversion layer can be configured to convert incident light within an incident wavelength range to emitted light within one or more emitted wavelength ranges. For an optical display, the incident light can be in the blue wavelength range and the plurality of sub-pixels can be selected to provide an acceptable color gamut for visual display. A four-color display designed to produce 100% of REC2020 can include, for example, red, green, blue and cyan sub-pixels. A four-color display designed to preserve night vision might add a deep-red (DR) sub-pixel with a peak emission wavelength greater than about 720 nm.

For certain applications, it can be desirable that color converters provided by the present disclosure exhibit a quantum conversion efficiency from blue light at 455 nm to green or red light of greater than 80%, that the green and red sub-pixels have less than 2% blue leakage through the green and red sub-pixels, that the layer thickness be less than 2 μm, that the sub-pixels be situated on a pitch of 3.3 μm or less, that the cross-talk or extinction ratio between adjacent sub-pixels can be less than 1000:1, and that the color conversion layer be compatible with $SiO_2$ sealant technology and other dielectric films configured to provide a hermetic seal over a useful time frame.

In certain color conversion layers blue light from the LED array can be transmitted through a blue transmissive sub-pixel. In certain color converters LEDs can emit at a wavelength range such as from 400 nm to 430 nm, and the blue sub-pixels can comprise a plurality of quantum dots capable of absorbing in the wavelength range from 400 nm to 430 nm and emitting in the blue wavelength range, for example from 450 nm to 490 nm.

In certain color converters, an LED array can emit in the near ultraviolet wavelength range, for example, from 300 nm to 400 nm or other suitable wavelength range.

In certain color converters, an LED array can emit in the near IR wavelength range, for example, from 780 nm to 1700 nm or other suitable wavelength range and the quantum dots can absorb multiple low energy photons and up-convert to the desired visible wavelength.

In certain color conversion layers, all or a portion of the plurality of sub-pixels can comprise quantum dots capable of emitting in the red to near infrared wavelength range such as from 650 nm to 750 nm. Near infrared displays can be useful for night vision applications.

A color conversion layer can comprise a plurality of pixels. For example, a color conversion layer can comprise from 1,000 to 1,000,000 pixels, from 5,000 to 50,000 pixels, or from 10,000 to 100,000 pixels. A color conversion layer can comprise, for example, greater than 1,000 pixels, greater than 5,000 pixels, greater than 10,000 pixels, greater than 100,000 pixels, or greater than 1,000,000 pixels.

A color conversion layer can comprise pixels emitting in a single color or can comprise groups of sub-pixels where each group of sub-pixels emits within a different range of wavelengths. Any suitable number of groups of sub-pixels emitting within a different range of wavelengths can be used. An example of a pixel comprising four sub-pixels is shown in FIG. 9 with the sub-pixels emitting in the red, green, blue and cyan wavelength ranges. FIG. 9 shows an array of hexagonally-shaped sub-pixels 901. Pixel 902 includes red sub-pixel 901a, cyan sub-pixel 901b, green sub-pixel 901c and blue sub-pixel 901d.

The plurality of sub-pixels can be configured to convert incident light within a first wavelength range to emitted light within one or more wavelength ranges. For example, the incident light can be in the blue wavelength range and the emitted light can be in the red, green, deep red, and blue wavelength ranges.

A plurality of sub-pixels can also be configured without any color conversion layer such that the incident pump wavelength is directly emitted from a sub-pixel. For example, referring to FIG. 9, a blue sub-pixel can comprise blue light emitted by a blue pump LED or can be blue emission of a sub-pixel comprising blue-emitting quantum dots.

A sub-pixel can have a maximum in-plane dimension, for example, from 1 μm to 4 μm, from 1 μm to 3 μm, or from 1 μm to 2 μm.

A sub-pixel can have a maximum in-plane dimension, for example, less than 5 μm, less than 4 μm, less than 3 μm, less than 2 μm, or less than 1 μm.

A sub-pixel can have a depth, for example, 0.5 μm to 4 μm, from 0.5 μm to 4 μm from 0.5 μm to 3 μm, or from 0.5 μm to 2 μm.

A sub-pixel can have, for example, a height from 0.5 μm to 3 μm and a width from 0.5 μm to 3 μm, a height from 1 μm to 3 μm and a width from 1 μm to 3 μm, or a height from 1 μm to 2 μm and a width from 1 μm to 2 μm.

A sub-pixel can have a depth that is the same as or greater than the maximum in-plane dimension.

A sub-pixel can have an aspect ratio, for example, from 12:1 to 1:12, from 10:1 to 1:10, from 8:1 to 1:8, from 6:1 to 1:6, from 4:1 to 1:4, from 3:1 to 1:3, from 2:1 to 1:2, or 1.5:1 to 1:1.5.

A sub-pixel can have an aspect ratio (height:width), for example, greater than 1:1, greater than 2:1, greater than 4:1, greater than 6:1, greater than 8:1, greater than 10:1, or greater than 12:1. A sub-pixel can have an aspect ratio (height:width), for example, less than 12:1, less than 10:1, less than 8:1, less than 5:1, less than 4:1, less than 3:1, less than 2:1, less than 1:1, less than 0:5:1 or less than 0.2:1.

A sub-pixel can have a volume, for example, from 0.1 $μm^3$ to 70 $μm^3$, from 1 $μm^3$ to 64 $μm^3$, from 3 $μm^3$ to 40 $μm^3$, from 6 $μm^3$ to 50 $μm^3$, or from 10 $μm^3$ to 40 $μm^3$. A sub-pixel can have a volume, for example, less than 70 $μm^3$, less than 60 $μm^3$, less than 50 $μm^3$, less than 40 $μm^3$, less than 30 $μm^3$, less than 20 $μm^3$, less than 10 $μm^3$, or less than 1 $μm^3$.

A sub-pixel can have an aspect ratio (height:width) from 10:1 to 2:1, from 8:1 to 2:1, from 6:1 to 2:1, or from 4:1 to 2:1; and a height from 0.5 μm to 3 μm, or from 1 μm to 3 μm.

A sub-pixel can have an aspect ratio (height/width) from 10:1 to 2:1, from 8:1 to 2:1, from 6:1 to 2:1, or from 4:1 to 2:1; and a width from 1 μm to 3 μm, or from 1 μm to 2 μm.

A sub-pixel can have an aspect ratio (height/width) from 16:1 to 4:1, from 12:1 to 4:1, from 10:1 to 4:1, from 8:1 to 4:1 or from 6:1 to 4:1; and a height from 0.5 μm to 3 μm, or from 1 μm to 3 μm.

A sub-pixel can have an aspect ratio (height/width) from 16:1 to 4:1, from 12:1 to 4:1, from 10:1 to 4:1, from 8:1 to 4:1, or from 6:1 to 4:1; and a width from 1 μm to 3 μm, or from 1 μm to 2 μm.

This compares to an aspect ratio (height/width) of about 1:2 for a 20 μm-pitch quantum dot LED used in television displays.

A sub-pixel can have any suitable cross-sectional profile. For example, a sub-pixel can have a square cross-sectional profile, a hexagonal cross-sectional profile, or a round cross-sectional profile.

A sub-pixel can have a width, for example, from 0.5 μm to 10 μm, and the sub-pixel area can be, for example, from 0.2 $μm^2$ to 30 $μm^2$.

A sub-pixel can be bounded by a material such as an inorganic material or an organic material.

The material bounding a sub-pixel can be selected to be non-absorbing to visible radiation such radiation in the red, green and blue wavelength range; to withstand subsequent processing temperatures; and/or to reflect radiation in the red, green and blue wavelength range.

Examples of suitable inorganic materials include semiconductors, metals and metal alloys. For example, the material bounding a sub-pixel can comprise aluminum.

Examples of suitable organic materials include polymer, polymer composites, thermally conductive polymer composites, or electrically conductive polymer composites.

A sub-pixel can comprise a cavity or well defined within a thin film such as cavities within an aluminum thin film.

A sub-pixel can comprise a feature deposited or built up on a substrate in which the spaces between adjacent sub-pixels are filled with a material. A sub-pixel can be defined by cavities created by a subtractive process including, for example, chemically-based processes such as chemical etching, physically-based processes such as ion milling, or combinations thereof such as plasma etching. A sub-pixel can be defined by cavities created by an additive process including, for example, chemically based processes such as electrochemical plating, physically based processes such as physical vapor deposition, evaporation, or sputtering, or combinations thereof such as atomic layer deposition, chemical vapor deposition, or laser guided plating.

The plurality of sub-pixels can comprise a plurality of color conversion elements disposed on a common substrate. For example, the common substrate can be an aluminum layer. The color conversion elements can be defined as cavities or wells within an aluminum substrate such that the and sidewalls comprise aluminum. The bottom of a sub-pixel can comprise a transmissive material such as a blue-transmissive material to allows irradiation of the sub-pixel by blue-emitting LEDs. A color conversion element can be defined by a substrate and material between the color conversion elements. The substrate and separating material can be the same or different.

A sub-pixel can have vertical side walls or non-vertical sidewalls. The sidewalls can be configured to facilitate forward light scattering. The side walls can be configured to be reflective to the light from the LEDs and/or reflective to the light emitted by quantum dots within the sub-pixel.

Side walls of a sub-pixel may be configured to reflect, scatter, and/or guide light to control the far filed emission patter of light emitted/transmitted by a sub-pixel. For example, sub-pixel sidewalls can be structured such that light at the excitation wavelength of the quantum dots and/or can reflect or guide light emitted by the quantum dots. This can be accomplished by coating the sidewalls of a sub-pixel with a material that has a different refractive index at the excitation wavelength and at the emission wavelength.

Sub-pixels can be configured to convert incident light within a first wavelength range to light within a second wavelength range. Other sub-pixels can be configured to transmit light through the sub-pixel. This is shown in FIG. 1 where sub-pixels 104a and 104b convert blue light to green and red light, respectively, and pixel 104c transmits blue light.

Color converting sub-pixels can comprise a plurality of quantum dots. Transmitting sub-pixels can comprise materials that do not absorb the incident radiation.

Transmitting sub-pixels can comprise a material configured to modify the transmission pattern to be similar to the emission pattern of color converting sub-pixels.

Quantum dots are semiconductor materials having a size, composition, and structure in which the electrical and optical characteristics differ from the bulk properties due to quantum confinement effects. Fluorescence of quantum dots results from the excitation of a valence electron by light absorption, followed by the emission at a lower energy wavelength as the excited electrons return to the ground state. Quantum confinement causes the energy difference between the valence and conduction bands to change depending on the size, composition and structure of a quantum dot. For example, the larger the quantum dot, the lower the energy of its fluorescence spectrum. The photoluminescence emission wavelength of a quantum dot can have a sharp emission spectrum and exhibit a high quantum efficiency.

Quantum dots can have any suitable geometry such as, for example, rods, disks, prolate spheroids, and crystalline, polycrystalline, or amorphous nanoparticles that can convert light at a suitable wavelength or range of wavelengths, absorb selected wavelengths of light, and/or convert one form of energy into another.

Examples of quantum dot semiconductor materials include, for example, Groups II-VI, III-V, IV-VI semiconductor materials. Suitable quantum dot materials include CdS, CdSe, CdTe, ZnS, ZnSe, ZnTe, GaAs, GaP, GaAs, GaSb, HgS, HgSe, HgTe, InAs, InP, InSb, AlAs, AlP, and AlSb. Other examples of suitable quantum dot materials include InGaP, ZnSeTe, ZnCdS, ZnCdSe, and CdSeS. Multicore structures are also possible. Examples of multicore quantum dot configurations include a quantum dot having a semiconductor core material, a thin metal layer to protect the core from oxidation and to facilitate lattice matching, and a shell to enhance the luminescence properties. The core and shell layers can be formed from the same material, and may be formed, for example, from any of the listed semiconductor materials. A metal layer can comprise Zn or Cd. A core of a quantum dot can comprise a graded composition configured to distribute the lattice mismatch that normally occurs at the core-shell interface over a greater distance to improve performance and/or reliability of a quantum dot. For example, a quantum dot can comprise multiple shells for purposes of distributing core-shell lattice mismatch, and/or controlling the exciton confinement and/or electron-hole distribution, and/or to add a layer to improve environmental.

A quantum dot can have a diameter, for example, from 1 nm to 10 nm, such as from 1 nm to 8 nm, from 1 nm to 6 nm, from 1 nm to 5 nm, or from 2 nm to 4 nm.

The plurality of quantum dots can have a polydispersity index (PDI less than 0.8 PDI, such as less than 0.7 PDI, less than 0.6 PDI, less than 0.5 PDI, less than 0.4 PDI, or less than 0.3 PDI. The plurality of quantum dots can have, for example, a PDI from 0.1 to 0.8, from 0.2 to 0.7, or from 0.3 to 0.6. The PDI can be determined using light scattering. For example, dynamic light scattering DLS is a commonly used method. Another method that can give more accurate results concerning the apparent size of a quantum dot in a use environment is size exclusion chromatography To maintain a separation between quantum dots that will minimize FRET, a quantum dot can comprise an exterior layer, which can be continuous or discontinuous. An exterior layer of a quantum dot can serve one or more additional functions such as providing a desired electronic property and/or providing a desired chemical property. A quantum dot generally has an initial outer shell upon which further shells can be deposited, and the surface of a quantum dot can comprise ligands such as organic molecules, that further modify the way a quantum dot interacts with the environment, Reduction of undesired non-radiative energy transfer may be realized using high-bandgap outer coating(s) and/or by designing the ligands to establish a minimum spacing between quantum dots.

A quantum dot coating can have an average thickness, for example, from 1 nm to 6 nm.

An exterior quantum dot layer can comprise a coating, which can comprise a single layer or multiple layers.

A quantum dot coating can comprise a wavelength-selective coating. For example, a wavelength-selective coating can be configured to transmit light in the blue wavelength range and transmissive to light in the red or green wavelength range.

Quantum dots can comprise a reactive coating. A reactive coating can comprise unreacted reactive functional groups capable of co-reacting with complimentary reactive functional groups.

For example, a semiconductor shell can be grown onto the semiconductor core to protect and passivate the semiconductor core of the quantum dot. The semiconductor shell increases the core emission efficiency and stability. Multilayer structures are also possible. Examples of multilayer structures include a first shell material grown onto the core, followed by a second shell material and so on to enhance luminescence properties. The shell may function to absorb light at a specific spectrum that is different from the emission spectrum from the quantum dot.

A quantum dot can comprise multiple coatings for purposes of distributing core-shell lattice mismatch, controlling exciton confinement, controlling electron-hole distribution, and/or improving environmental robustness.

An exterior layer can comprise, for example, a metal oxide coating. Suitable metal oxide coating in accordance with embodiments include, ZnO, $ZrO_2$, $Nb_2O_3$, $Sb_2O_3$, NiO, $Cu_2O$, $WO_3$, SnOx, $Cr_2O_3$, $V_2O_5$, $MoO_3$, $ReO_3$, $In_2O_3$, $BiVO_4$, and $SrTiO_3$.

A quantum dot can also comprise organic ligands and/or organic ligands bound to the surface of the quantum dot semiconductor core or to a coating surrounding a quantum dot semiconductor core. The ligands can be bound directly to the quantum dot or to a coating on the exterior surface of a quantum dot.

A quantum dot can comprise a ligand or combination of ligands. A ligand or combination of ligands can serve one or more purposes. For example, ligands can minimize agglomeration of quantum dots, provide a spacing between adjacent quantum dots, provide a protective exterior surface, and/or provide reactive functional groups capable of reacting with other constituents of a pixel.

A ligand can comprise a linear or branched molecule in which one end is covalently bound to the surface of the quantum dot.

A quantum dot can have a core/shell configuration where the shell can be a metal oxide, metal sulfide, or metal phosphide, and can have one or more layers of organic or hybrid organic ligands that coordinate non-covalently with the surface of the quantum dot shell.

A quantum dot can comprise an exterior surface comprising spacing ligands. A spacing ligand can be selected such that when assembled within a sub-pixel adjacent quantum dots maintain a spacing that minimizes FRET. For example, a spacing ligand can maintain a spacing from 1 nm to 10 nm between adjoining quantum dots, from 2 nm to 8 nm, from 3 nm to 7 nm, or from 4 nm to 6 nm between adjoining quantum dots. Spacing ligands can be selected to maintain an average separation between adjoining quantum dots greater than 2 nm, greater than 3 nm, greater than 4 nm, greater than 5 nm, greater than 6 nm, greater than 7 nm, or greater than 8 nm.

A ligand can comprise a reactive ligand. A reactive ligand can comprise one or more chemically reactive functional groups. A reactive ligand can be bound, such as covalently bound, to the quantum dot, to another ligand bound to a quantum dot, or to an exterior coating on a quantum dot.

A reactive ligand can be configured, for example, to react with a complimentary functional group of another quantum dot, to react with a complimentary functional group of a binder, and/or to react with a complimentary functional group of a ligand bound to an organic or inorganic particle.

The reactive functional groups can be selected to react upon exposure to actinic radiation such as ultraviolet (UV) radiation, or radiation in the blue wavelength range.

Examples of chemistries reactive upon exposure to actinic radiation include thiol/ene, thiol/yne, and certain Michael acceptors such as (meth)acryloyl/(meth)acryloyl. Accordingly, a reactive functional group can be selected from a thiol, an alkenyl, an alkynyl, and a (meth)acryloyl group.

A reactive ligand can react with a complimentary functional group upon exposure to thermal radiation. Thermally activated curing chemistries include thiol/epoxy and thiol/Michael acceptor chemistries.

Examples of reactive ligands include amino-terminated acrylates, carboxy-terminated acrylates, sulfhydryl-terminated acrylates, alkenyl-terminated acrylates, and thiol-terminated acrylates.

A ligand can comprise one or more functional groups capable of reacting with the quantum dot.

A non-reactive ligand can comprise one or more functional groups capable of covalently binding to a quantum dot, and the other end of the non-reactive ligand can include one or more chemical moieties that are not capable of reacting with other constituents of a sub-pixel.

A reactive ligand can comprise one or more functional groups capable of covalently bonding to a quantum dot, and the other end of the reactive-ligand can include one or more chemical moieties that are capable of reacting with one or more other constituents of a sub-pixel.

A ligand can be configured to promote adhesion, for example, between adjacent quantum dots, between a quantum dot and a side wall of a sub-pixel, and/or between a quantum dot and organic and/or inorganic particles within a sub-pixel.

Examples of suitable adhesion promoters include organofunctional alkoxysilanes.

A ligand can be configured to control the minimum distance between the sub-pixel sidewall quantum dot.

Sub-pixels provided by the present disclosure can comprise a high density of quantum dots. For example, a sub-pixel can comprise from 10 vol % to 50 vol % quantum dots, from 15 vol % to 45 vol %, from 20 vol % to 40 vol %, or from 25 vol % to 35 vol % quantum dots, where vol % is based on the total volume of a sub-pixel. A sub-pixel can comprise, for example, greater than 10 vol % quantum dots, greater than 15 vol %, greater than 20 vol %, greater than 25 vol %, greater than 30 vol %, greater than 35 vol %, greater than 40 vol %, or greater than 45 vol % quantum dots, where vol % is based on the total volume of the sub-pixel.

A sub-pixel can comprise, for example, less than 50 vol % quantum dots, less than 45 vol %, less than 40 vol %, less than 35 vol %, less than 30 vol %, less than 25 vol %, less than 20 vol %, or less than 15 vol % quantum dots, where vol % is based on the total volume of the sub-pixel.

The plurality of quantum dots within a sub-pixel can be randomly packed or packed in a regular lattice such as a cubic lattice, which in addition to simple cubic, includes bcc and fcc packing geometries, a tetrahedral lattice, or a hexagonal system including hcp. While bcc and fcc structures can be regarded as interpenetrating cases of simple cubic, they are mentioned here to be inclusive of the case when the QDs are not all the same, particularly the case where the core-shell structures are the same, but the ligand structures differ. For example, a sub-pixel can comprise quantum dots having two or more different ligand structures, where one ligand structure can be configured, for example, to interact with the wall of the sub-pixel and another ligand structure can be configured, for example, to optimize quantum dot function.

A sub-pixel can comprise a plurality of quantum dots in which each of the plurality of quantum dots are the same. For example, similar quantum dots can comprise the same semiconductor material and can have the same exterior composition.

A sub-pixel can comprise a plurality of quantum dots in which at least some of the quantum dots are different that other of the plurality of quantum dots. In such embodiments, the plurality of quantum dots can have the same semiconductor material and have the same average diameter and have a different exterior coating. For example, a first plurality of quantum dots can comprise a ligand or coating comprising a first reactive functional group, and a second plurality of quantum dots can comprise a ligand or coating comprising a second reactive functional group. The first reactive functional group can be reactive with the second functional group.

A sub-pixel can comprise, for example, a binder, organic particles, and/or organic particles.

A binder can be selected to provide a matrix to retain the quantum dots.

A binder can be provided as a material capable of intercalating between the plurality of quantum dots.

A binder can be provided as a particle, such as a particulate having an average diameter less than that of the quantum dots.

A binder can comprise a thermoset composition or a thermoplastic composition. A thermoset binder can have a low initial viscosity to facilitate filling the sub-pixel cavities with a quantum dot-containing composition. Following curing, the binder can have a high degradation temperature to facilitate using semiconductor processing methods to integrate the color converter with other components of a display.

A quantum dot-containing composition can be deposited and cured under a vacuum or inert atmosphere to minimize degradation of the quantum dots caused by exposure to atmospheric oxygen.

A sub-pixel can comprise organic particles and/or inorganic particles.

An organic particle can function, for example, as a spacer and/or as a binder. An organic binder particle can comprise, for example, reactive functional groups capable of reacting with functional groups on a quantum dot or other particle within a sub-pixel.

An organic particle can be formed from any suitable organic material.

An organic particle can be selected to withstand high temperatures. Examples of suitable high temperature polymers include tetrafluoroethylene (ETFE), ethylene chlorotrifluorethylene ECTFE, polytetrafluoroethylene (PTFE), perfluoroalkoxy alkanes (PFA), polybenzimidazole (PBI), polyamide imide (PAI), polyetherimides (PEI), polyetherketone (PEK), polyetheretherketone (PEEK), polyetherketoneketone (PEKK), polyphenylene sulfides (PPS), phthalonitriles, polysulfones (PSU), polyethersulfones (PES), polyphthalamide (PPA), PTFE high temperature nylon, and combinations of any of the foregoing.

An organic particle can comprise, for example, a cinnamate-based polyacrylate, a polyester system derived from cinnamate derivatives such as p-hydroxycinnamic acid (4HCA), ferulic acid (MHCA), caffeic acid (DHCA), 4-aminocinnamic acid (4ACA), or a polyimide system derived from cyclobutane tetracaboxylic acid dianhydrides and aminocinnamate derivatives.

An organic particle can be selected to facilitate the ability of a sub-pixel to withstand thermal stress. Examples of suitable elastomeric polymers include polyethers, polybutadienes, fluoroelastomers, perfluoroelastomers, ethylene/acrylic copolymers, ethylene propylene diene terpolymers, nitriles, and polythiolamines, and combinations of any of the foregoing.

An inorganic particle can be configured to enhance absorption cross section of the quantum dot and thereby improve the wavelength conversion efficiency of a quantum dot. For example, an efficiency enhancing inorganic particle can comprise silver or gold. The wavelength conversion efficiency enhancing particle can comprise a solid silver or gold particle or can comprise a solid organic or inorganic particle having a silver or gold coating.

Particles that reflect the incident radiation such as blue light can also reduce transmission of the incident light through a sub-pixel by increasing the internal reflection of the incident radiation within the sub-pixel.

A sub-pixel can comprise an organic matrix material in which the plurality of quantum dots are embedded. The matrix material can comprise a cross-linkable material such as a thermoset. A matrix material can initially have a low viscosity and be curable upon exposure to, for example, thermal energy or actinic radiation such as UV radiation. The matrix material can comprise compounds capable chemically reacting with reactive ligands on quantum dots, spacer particles, other constituents of a sub-pixel, and/or sub-pixel sidewalls.

It can be desirable that a matrix material be stable to subsequent processing including semiconductor processing conditions.

A sub-pixel can be configured to transmit radiation. For example, a color-conversion sub-pixel can be radiated in the blue wavelength range. A non-color-conversion sub-pixel can be configured to transmit the blue light and comprise material transmissive to radiation, for example, in the blue wavelength range from 405 nm to 475 nm. A blue-transmissive sub-pixel can comprise, for example, silicon dioxide, such as silicon dioxide particles or a silicon dioxide thin film. The particles can be configured to produce a transmission pattern that is similar to the emission pattern similar to that of the color converting sub-pixels.

The conversion efficiency a sub-pixel can depend on the conversion efficiency of the quantum dots as well as geometric factors.

For example, conversion efficiency can be determined by (1) the geometric pattern of the incident excitation radiation; (2) the losses at the entrance interface to a sub-pixel, which includes absorption, reflections, and the geometry of the entrance; (3) absorption and scattering of the excitation radiation by the sub-pixel sidewalls and by the bulk matrix material; (4) the absorption cross-section of the quantum dots at the excitation wavelength; (5) the efficiency of the quantum dot with respect to non-radiative processes: (6) the emission pattern of the quantum dot which can depend, for example, on the shape and composition of the quantum dot: (7) the energy difference between the excitation and emission wavelengths; (8) the recirculation of light within the sub-pixel, which includes the effects of coatings on either end of the sub-pixel and reabsorption by the quantum dots; and (9) the emission distribution oat of exit of sub-pixel, which happens to be one of the most important factors.

The conversion efficiency of quantum dots can depend on factors such as, for example, local heating, thermal conduction, thermal dissipation, material absorption, bleaching of the quantum dot, and/or creation and/or activation of defects in the quantum dot.

A plurality of sub-pixels can have any suitable configuration. For example, a plurality of sub-pixels can be configured as a square matrix, a triangular matrix, a hexagonal matrix, or other regular matrix pattern.

Certain sub-pixels of the plurality of sub-pixels can have different dimensions including a different height and/or width with respect to other sub-pixels of the plurality of sub-pixels. The different sub-pixel dimensions can be used to provide sub-pixels having a different intensity or saturation.

The plurality of sub-pixels can be configured, for example, in the form of a regular array, a regular pattern, or an irregular pattern.

The plurality of sub-pixels can comprise one or more groups of sub-pixels where each of the one or more groups of sub-pixels emits or transmits radiation at a different wavelength.

The plurality of sub-pixels can comprise, for example, a group of sub-pixels capable of providing radiation in the blue wavelength range, a group of sub-pixels capable of providing radiation in the green wavelength range, and a group of sub-pixels capable of providing radiation in the red wavelength range.

The groups of sub-pixels capable of providing radiation in the red and green wavelength ranges can comprise a plurality of quantum dots capable of converting incident radiation in the blue wavelength range. Sub-pixels capable of providing radiation in the blue wavelength range can be transmissive to blue radiation.

A plurality of sub-pixels can comprise, for example, a group of sub-pixels comprising a plurality of quantum dots capable of emitting radiation within a wavelength range from 515 nm to 565 nm when irradiated with blue light in the wavelength range from 405 nm to 475 nm.

A plurality of sub-pixels can comprise, for example, a group of sub-pixels comprising a plurality of quantum dots capable of emitting radiation within a wavelength range from 595 nm to 635 nm when irradiated with blue light in the wavelength range from 405 nm to 475 nm.

A plurality of sub-pixels can comprise, for example, a group of sub-pixels comprising a plurality of quantum dots capable of emitting radiation within a wavelength range from 450 nm to 475 nm when irradiated with blue light in the wavelength range from 405 nm to 475 nm, with the two-sigma point in the long wavelength tail of the excitation wavelength being less than the emission wavelength.

A plurality of sub-pixels can comprise, for example, a group of sub-pixels comprising a plurality of quantum dots capable of emitting radiation within a wavelength range from 650 nm to 750 nm when irradiated with blue light in the wavelength range from 405 nm to 475 nm.

A plurality of sub-pixels can comprise, for example, a group of sub-pixels comprising a plurality of quantum dots capable of emitting radiation within a wavelength range from 650 nm to 750 nm when radiated with blue light in the wavelength range from 470 nm to 620 nm.

A plurality of sub-pixels can comprise, for example, a group of sub-pixels comprising a plurality of quantum dots capable of transmitting light in the blue wavelength range from 405 nm to 475 nm.

For example, a plurality of sub-pixels can comprise a first group of sub-pixels, where each sub-pixel of the first group of sub-pixels comprises a first plurality of quantum dots capable of emitting at a wavelength within a green wavelength range from 515 nm to 565 nm when irradiated with blue light within a wavelength range from 405 nm to 475 nm; a second group of sub-pixels, wherein each sub-pixel of the second group of sub-pixels comprises a second plurality of quantum dots capable of emitting at a wavelength within a red wavelength range from 595 nm to 635 nm when irradiated with blue light within a wavelength range from 405 nm to 475 nm; and a third group of sub-pixels, wherein each sub-pixel of the third group of sub-pixels comprises a third plurality of quantum dots capable of converting violet light within a wavelength range from 400 nm to 425 nm to a blue wavelength range of 450 nm to 475 nm.

Each group of sub-pixels can independently be configured in an array, which can be the same or different than another array of sub-pixels.

Each group of sub-pixels of the plurality of sub-pixels can be configured in any suitable tiling arrangement suitable for providing a display. The arrays of sub-pixels can be interleaved to provide a full color display.

Certain sub-pixels of a plurality of sub-pixels forming a color converter may not comprise quantum dots. Sub-pixels without quantum dots do not convert incident radiation to another wavelength and are intended to transmit light, such as a light in the blue wavelength range, through the sub-pixel. Such sub-pixels can be filled, for example with an organic material that is transmissive to light in the blue wavelength range, such as greater than 90% transmissive, greater than 95% transmissive, or greater than 99% transmissive.

A color converter can comprise for example, from 10 sub-pixels to 1,000,000 sub-pixels such as, for example, from 100 sub-pixels to 750,000 sub-pixels, from 1,000 sub-pixels to 500,000 sub-pixels, or from 10,000 sub-pixels to 100,000 sub-pixels. A color converter can comprise, for example, greater than 10 sub-pixels, greater than 1,000 sub-pixels, greater than 10,000 sub-pixels, greater than 100,000 sub-pixels, greater than 500,000 sub-pixels, or greater than 1,000,000 sub-pixels. A color converter can comprise, for example, less than 2,000,000 sub-pixels, less than 1,000,000 sub-pixels, less than 500,000 sub-pixels, less than 100,000 sub-pixels, less than 10,000 sub-pixels, less than 1,000 sub-pixels, or less than 100 sub-pixels.

A color converter can have a PPI (pixels per linear inch), for example from 100 PPI to 50,000 PPI, from 1,000 PPI to 50,000 PPI, from 5,000 PPI to 50,000 PPI, or from 10,000 PPI to 50,000 PPI.

A color converter can have a PPI, for example, from 100 PPI to 5,000 PPI, from 200 PPI to 5,000 PPI, or from 500 PPI to 5,000 PPI.

A color converter provided by the present disclosure having a thickness less than 10 μm and a PPI greater than 10,000.

To accomplish this, it is desirable that the color converter be a single-pass device with minimal transmission of blue light for the colored sub-pixels. For example, for red and green sub-pixels that are irradiated with blue light, it is desirable that the sub-pixels not comprise a wavelength-selective filter, that blue light transmitted through each sub-pixel be less than 5%, corresponding to a color conversion purity of 95% (95 Red photons divided by 95 Red+5 Blue photons), and that the emission distribution be relatively narrow. Substantial gains in overall efficiency can be achieved by narrowing the emission angle. For example, a hemispherical emitter radiates into a little over 6 sr. An emission cone with an included angle of 66° subtends 1 sr.

To facilitate integration of a color converter provided by the present disclosure it is desirable that the materials used withstand semiconductor processing temperature such as temperatures greater than 200° C.

However, to the extent that the sub-pixels comprise organic material such as coatings and/or ligands on the quantum dots and organic matrix materials, the sub-pixels may not be able to withstand semiconductor processing temperatures. Nevertheless, organic materials capable of withstanding higher temperatures are desired.

A color converter can comprise a color conversion layer comprising a plurality of sub-pixels and one or more additional layers.

A color converter can comprise a substrate underlying the color conversion layer. The substrate can be a sacrificial layer that is used for fabricating the color conversion layer. The substrate can comprise an inorganic substrate such as a semiconductor substrate or a metal substrate.

A color converter can comprise a passivation layer overlying the color conversion layer. A passivation layer can serve to planarize the color conversion layer and/or to protect the color conversion layer during subsequent processing steps.

A color converter can comprise a wavelength-selective region overlying the color conversion layer and/or underlying the color conversion layer. A wavelength-selective region can comprise, for example, a Bragg reflector. An underlying wavelength-selective region can be configured to transmit blue light and reflect green or red light. An overlying wavelength-selective region can be configured to transmit red or green light and to reflect blue light.

Figure 2:
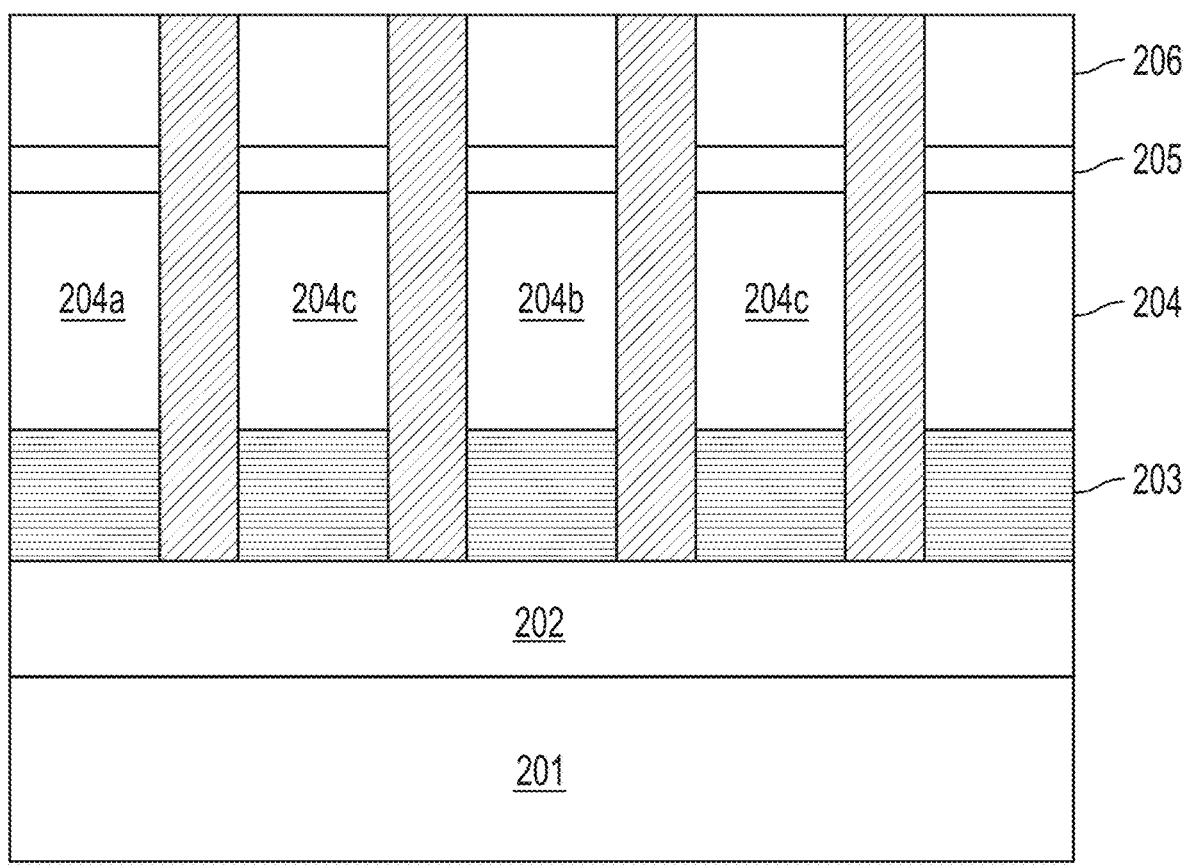
FIG. 2 shows an example of a green, red, and blue sub-pixels incorporating an underlying and overlying Bragg reflector provided by the present disclosure.

An example of a color converter comprising a wavelength-selective layer is shown in FIG. 2. The color converter shown in FIG. 2 includes a transparent layer 201, a release layer 202, a first wavelength-selective region 203 under lying at color conversion layer 204 including green sub-pixel 204a, red sub-pixel 204b, and blue sub-pixels 204c, a passivation or sealing layer 205, and a second wavelength-selective region 206 overlying the passivation layer 205. Transparent layer 201 can comprise, for example, sapphire; and release layer 202 can comprise, for example, GaN or SOI.

First wavelength-selective region 203 can be configured, for example, to transmit blue light within a first wavelength range and to reflect green and red light. Second wavelength-selective region 205 can be configured to reflect blue light within a first wavelength range and to transmit green, red light, and blue light within a second wavelength range. The color conversion layers and pixels can have a thickness, for example from 0.5 µm to 2 µm.

The color conversion layer can comprise aluminum or other metal between individual sub-pixels.

The second wavelength-selective region can have different properties over different sub-pixels. For example, the lateral portion of the second wavelength-selective region overlying the green and red sub-pixels can be configured to reflect the incident blue radiation and to transmit the green and red radiation emitted by the quantum dot-containing sub-pixels. The lateral portion of the second wavelength-selective region overlying the blue sub-pixels can be configured to transmit the incident blue radiation or may not be present and the region overlying the blue sub-pixels be filled with an optically transmissive material such as $SiO_2$.

A wavelength-selective region overlying the color conversion layer can be configured, for example, to reflect light at wavelengths less than 460 nm.

A wavelength-selective region can comprise a Bragg reflector and fabricated using any suitable combination of materials such as, for example $SiO_2$, $TiO_2$, hafnium oxides, tantalum oxides, and aluminum oxides.

A wavelength-selective region can comprise a surface configured to reduce the dispersion of light emitted and/or transmitted by the color conversion layer.

A color converter can comprise an overlying lens array comprising a plurality of lenses. The plurality of lenses can be aligned with a respective sub-pixel and can be configured to narrow the dispersion of the radiation emitted from the pixel. Examples of suitable nanostructured surfaces include nanometer-thick metal layers configured to enhance surface plasmon enhanced emission.

A color converter can include a decoupling layer underlying the color conversion layer. A decoupling layer can minimize coupling of light from one sub-pixel being transmitted into another sub-pixel. A decoupling layer can comprise, for example, silicon dioxide, an inorganic oxide, a ceramic, a metal oxide, a non-stoichiometric suboxide, a silicone, a sulfone, or other suitable organic material.

It is desirable that quantum dot-containing sub-pixels in an ultra-high-density color converter comprise a high density of quantum dots.

Depositing quantum dot-containing materials into the cavities using conventional ink-jet methods can be challenging because of the high material viscosity due to the high concentration of quantum dots and because of the possibility that are can be trapped within the cavities. Ink jet deposition under vacuum can at least to some extent minimize air entrapment.

A high density of quantum dots can be obtained by preparing an ink comprising quantum dots, depositing the ink into sub-pixel cavities and removing at least some of the matrix material from the cavity without removing the quantum dots. Removing the matrix material can be accomplished using gel deposition by permeation methods as described, for example, in U.S. application Ser. No. 16/172, 562, entitled Methods of Modifying the Composition of Material Layers, filed on Oct. 26, 2018, which is incorporated by reference in its entirety.

A high density of quantum dots can be obtained by filling the sub-pixel cavities with quantum dots and subsequently intercalating a binder into the cavities. The binder may intercalate into the entire sub-pixel free volume between the quantum dots or may serve as a capping layer and intercalate into the upper section of a sub-pixel.

A high density of quantum dots can be obtained by filling the sub-pixel cavities with quantum dots in combination with binder particles. The binder particles become dispersed within the sub-pixel cavity along with the quantum dots.

A high density of quantum dots can be obtained by filling the sub-pixel cavities with quantum dots comprising reactive ligands.

The binder, whether in the form of an ink, intercalated binder, binder particles, or reactive ligands can be cross-linked with the sub-pixels to secure the quantum dots. The binder reaction can be initiated, for example, using actinic radiation such as UV radiation, or thermally, depending on the curing chemistry employed.

An ink comprising quantum dots can be deposited into the sub-pixel cavities using, for example, roller coating, by pressing the ink into the cavities by wiping an elastomeric blade across the surface of the color conversion layer, or by squeegee coating. A vacuum can be used to facilitate the ability of the high viscosity quantum dot-containing ink to fill the high aspect ratio cavities.

As free flowing particulates, the quantum dots can be deposited into the sub-pixels using microfluidic deposition methods in which the sub-pixel cavities are filled through flow channels and then capped with a binder to secure the particles. Filling the pixels with free-flowing quantum dots can minimize the vol % of binder in the sub-pixel, and thereby increase the density of quantum dots within a sub-pixel.

A color converter can be fabricated, for example, by depositing an aluminum layer on a substrate to define a plurality of sub-pixels; depositing a plurality of first quantum dots in a first plurality of sub-pixels; depositing a second plurality of quantum dots in a second plurality of sub-pixels; depositing optically transmissive material in a third plurality of sub-pixels, to provide the three color vertices of the color gamut forming a color converter.

The substrate can comprise an $Al_2O_3$ layer; a $Si_3N_4$ lift-off layer overlying the $Al_2O_3$ layer; and a $SiO_2$ layer overlying the $Si_3N_4$ lift-off layer.

The aluminum layer can have a thickness from 1 μm to 3 μm.

The plurality of cavities can have a depth, for example, from 1 μm to 3 μm, a width from 1 μm to 3 μm, and a pitch from 3 μm to 5 μm.

As appropriate the color converter can include additional layers such as reflective layers, passivation layers, and sub-pixel cross-talk reduction layers.

To assemble the color converter onto an LED array, the color converter can be separated from the substrate by activating the lift-off layer and aligning and then bonding the separated color converter onto the LED array.

EXAMPLES

Embodiments provided by the present disclosure are further illustrated by reference to the following examples, which describe methods, compositions, and devices provided by the present disclosure. It will be apparent to those skilled in the art that many modifications, both to materials, and methods, may be practiced without departing from the scope of the disclosure.

Example 1

FIGS. 3A-3J transmitted blue light through an array of sub-pixels having different dimension and on different pitches. The sub-pixels shown in FIGS. 3A-3E have a 9.6 μm diameter on a 12.5 μm pitch (FIG. 3A); a 3.6 μm diameter on a 6 μm pitch (FIG. 3B); a 1.4 μm diameter on a 3.3 μm pitch (FIG. 3C); a 1.4 μm diameter on a 2.8 μm pitch (FIG. 3D); and a 1.4 μm diameter on a 2.3 μm pitch (FIG. 3E).

FIGS. 3F-3J show the corresponding sub-pixel arrays with a 200× magnification.

Example 2

Figure 4:
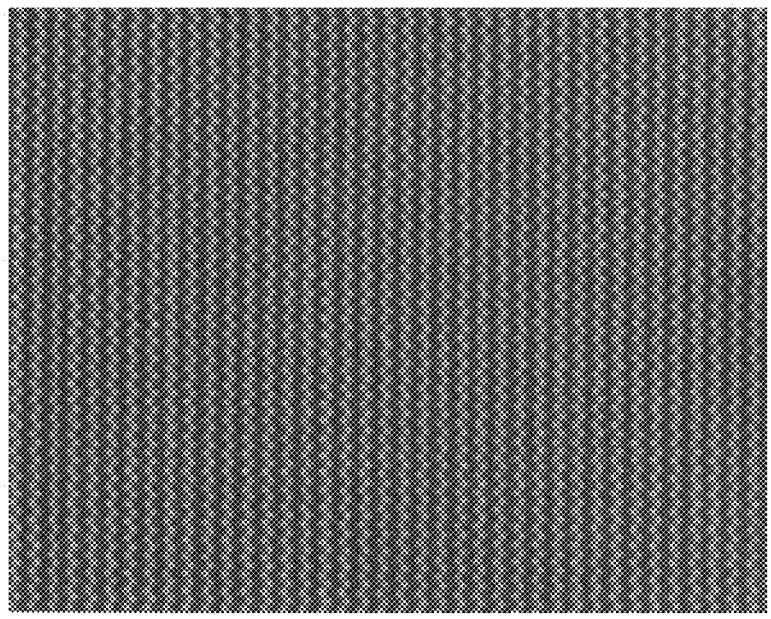
FIG. 4 shows transmitted blue light through an array of 1.4 µm-diameter sub-pixels having a pitch of 2.8 µm.

FIG. 4 shows sub-pixel windows having a diameter of 1.4 μm on a 2.8 μm pitch at 500× magnification.

Example 3

Figure 5A:
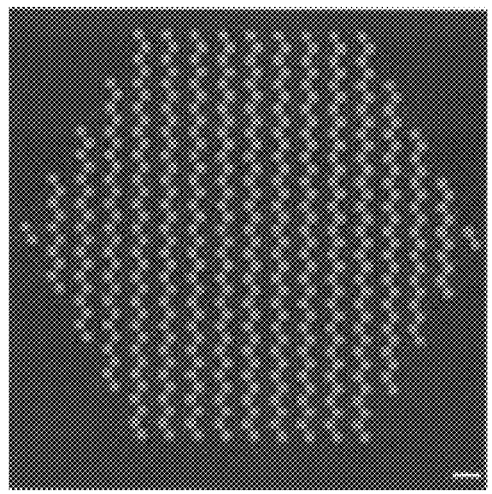
FIG. 5A shows transmitted blue light through an array of 9.6 µm-diameter sub-pixels on a 12.5 µm pitch.
Figure 5B:
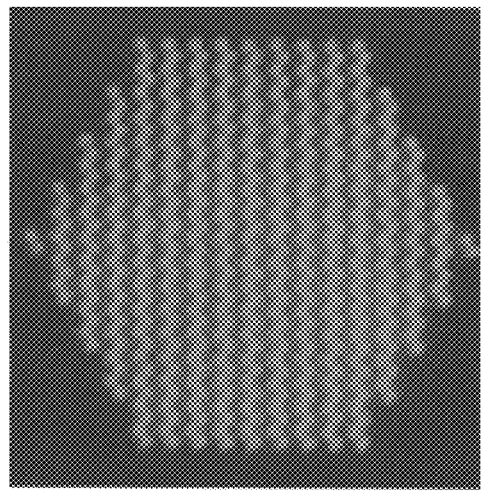
FIG. 5B shows green emission of an array of quantum dot-containing 9.6 µm-diameter sub-pixels on a 12.5 µm pitch having a thickness (depth) of 2 µm. The green quantum dot array can be pumped by the underlying blue sub-pixel array.
Figure 5C:
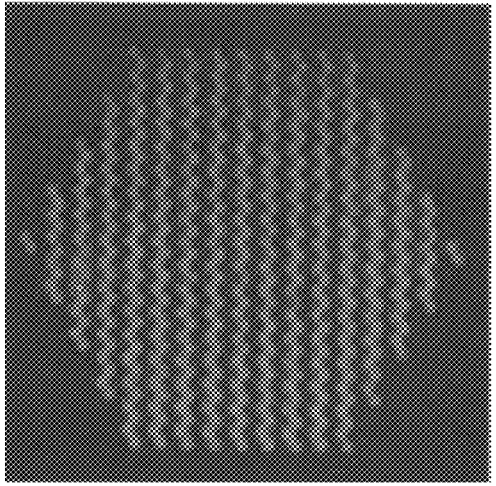
FIG. 5C shows red emission of an array of quantum dot-containing 9.6 µm-diameter sub-pixels on a 12.5 µm pitch having a thickness (depth) of 2 µm. the red quantum dot array is pumped by the underlying blue sub-pixel array.

FIGS. 5A-5C show blue, green and red sub-pixels, respectively. The sub-pixels have a diameter of 9.6 μm and a thickness of 2 μm. FIG. 5A shows the transmission of blue light through the sub-pixel array from an underlying LED array. FIG. 5B shows the green emission from quantum dots irradiated with blue LED light. The quantum conversion efficiency from blue to green light was 74% and the leakage of blue light was 12%. FIG. 5C shows the red emission from quantum dots irradiated with blue LED light. The quantum conversion efficiency from blue to red light was 57% and the leakage of blue light was 21%.

The green and red quantum dot-containing sub-pixels was prepared by pressing a quantum dot-containing ink into the wells.

Example 4

Figure 6A:
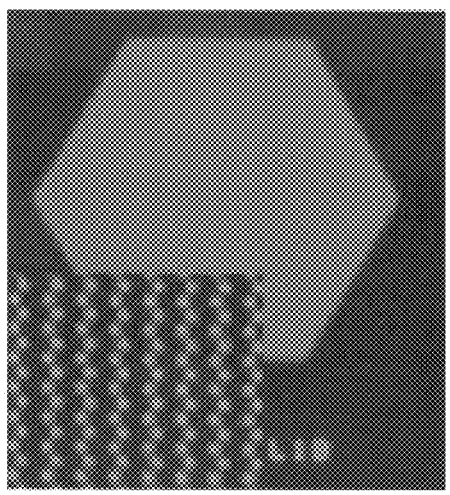
FIG. 6A shows transmitted blue light through an array of 1.4 µm-diameter blue sub-pixels on a 2.8 µm pitch and having a thickness (depth) of 2 µm.
Figure 6B:
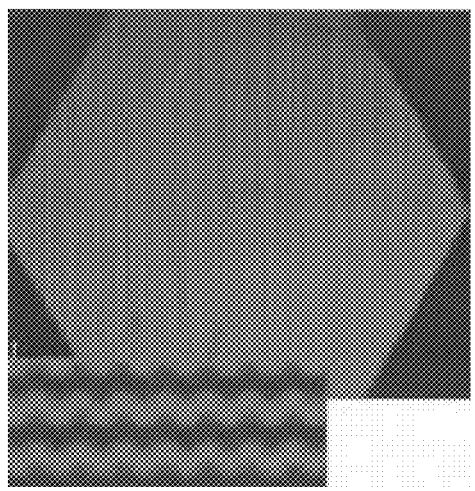
FIG. 6B shows green emission through an array of 1.4 µm-diameter green quantum dot-containing sub-pixels on a 2.8 µm pitch and having a thickness (depth) of 2 µm.
Figure 6C:
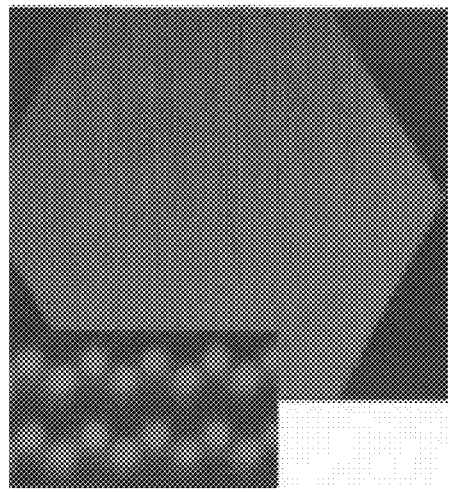
FIG. 6C shows green emission through an array of 1.4 µm-diameter red quantum dot-containing sub-pixels on a 2.8 µm pitch and having a thickness (depth) of 2 µm.

FIGS. 6A-6C show arrays of 2.8 μm diameter—sub-pixels (FIGS. 6A-6B) and 3.3 μm-diameter sub-pixels (FIG. 6C) having a depth of 2 μm. The magnifications are 200× and 500× (inset).

Example 5

Figure 7:
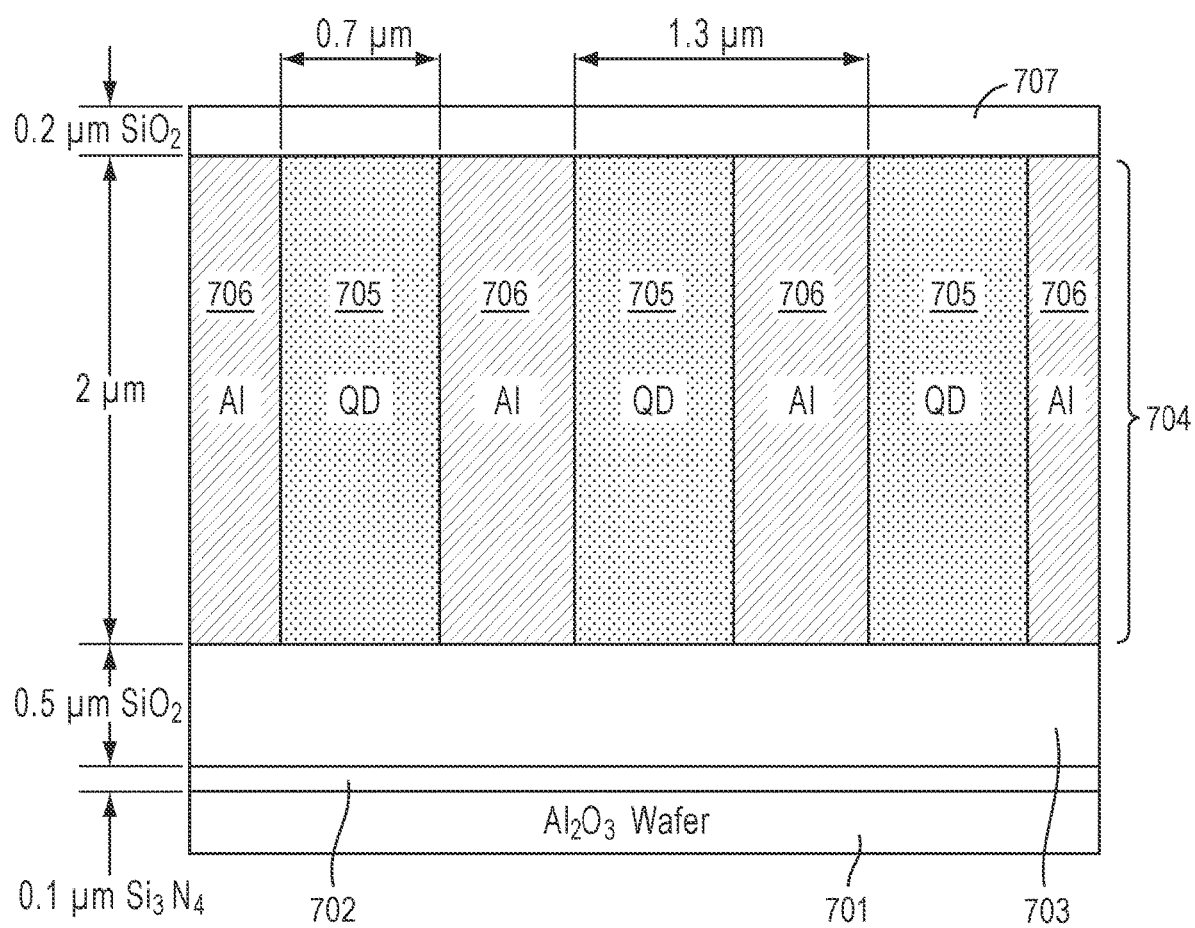
FIG. 7 shows an example of a color conversion layer provided by the present disclosure.

FIG. 7 shows an example of a color conversion layer with sub-pixel cavities. The structure includes an $Al_2O_3$ substrate 701, a 0.1 μm-thick $Si_3N_4$ lift-off layer 702, a 500 nm-thick $SiO_2$ layer 703, a 2 μm-thick layer 704 including sub-pixels 705 separated by aluminum 706, and a 0.2 μm-thick layer of $SiO_2$ 707. Sub-pixels 705 are filled with a quantum dot-containing composition and are 0.7 μm wide on a 1.3 μm pitch.

Example 6

Figure 8A:
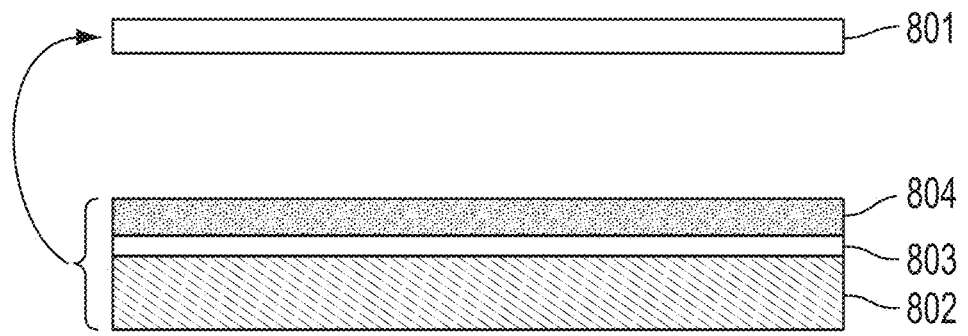
FIGS. 8A-8F show an example of steps used to fabricate a quantum dot color converter provided by the present disclosure.
Figure 8B:
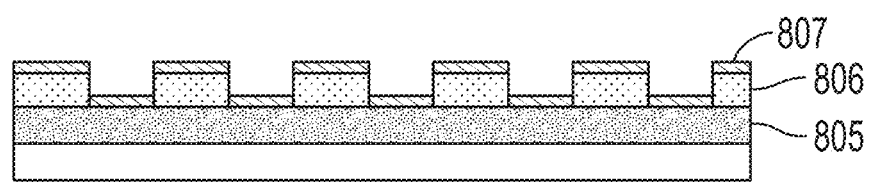
Figure 8C:
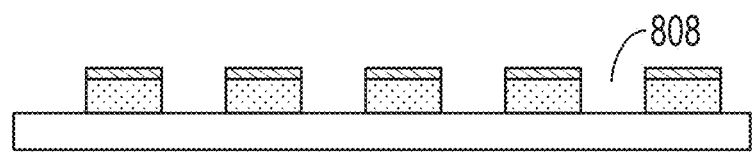
Figure 8D:
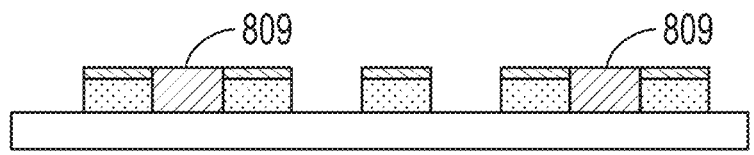
Figure 8E:
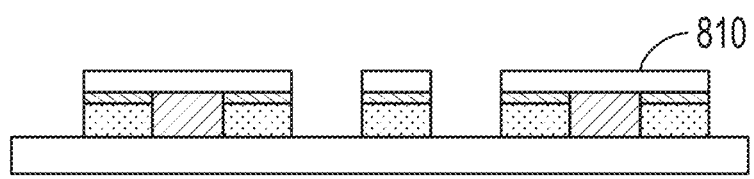
Figure 8F:
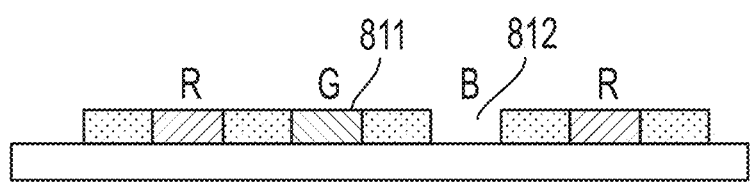

FIGS. 8A-8F show an example of steps used to fabricate a color converter. FIG. 8A shows details of a substrate 801 including an $Al_2O_3$ wafer, 802 a 0.1 μm-thick layer of $Si_3N_4$ 803, and a 0.5 μm-thick layer of $SiO_2$ 804. In FIG. 8B an aluminum layer 805 has been deposited on the substrate 801. A resist 806 has been selectively deposited onto the aluminum layer 805, and a chrome etch mask 807. FIG. 8C shows the structure after etching to define sub-pixels 808. As shown in FIG. 8D certain sub-pixels are filled with a red emitting quantum dot composition 809. The red sub-pixels are then coated with a protective layer such as $SiO_2$ 810 as shown in FIG. 8E and a green emitting quantum dot composition 811 is deposited in selected sub-pixels as shown in FIG. 8F. The blue transmitting sub-pixels 812 can be filled with a transmissive material and the color conversion layer coated with a passivation layer (not shown).

Finally, it should be noted that there are alternative ways of implementing the embodiments disclosed herein. Accordingly, the present embodiments are to be considered as illustrative and not restrictive. Furthermore, the claims are not to be limited to the details given herein and are entitled to their full scope and equivalents thereof

What is claimed is:

1. A color converter for an ultra-dense light-emitting diode array, comprising:
   a substrate;
   a color conversion layer, wherein the color conversion layer comprises:
   a first group of sub-pixels overlying the substrate, wherein, the first group of sub-pixels comprises a first plurality of quantum dots;
the first group of sub-pixels emit light within a first wavelength range; and
each sub-pixel independently comprises:
a volume less than 30 µm³;
a thickness from 1 µm to 3 µm;
a pitch less than 5 µm; and
a density of the quantum dots within the volume from 10 vol % to 50 vol %,
wherein vol % is based on the total volume of quantum dots less any ligands or other interstitial materials divided by the total volume of the sub-pixel.

2. The color converter of claim 1, wherein each sub-pixel is characterized by an aspect ratio (height:width) of from 2:1 to 10:1.

3. The color converter of claim 1, further comprising an additional plurality of sub-pixels, one for each sub-pixel making up a colored pixel, wherein the additional plurality of sub-pixels is configured to transmit light within an additional wavelength range.

4. The color converter of claim 3, wherein one of the additional plurality of sub-pixels does not contain a quantum dot color converting material and is configured to pass a pump wavelength.

5. The color converter of claim 1, wherein the light within the first wavelength range, a light within a second wavelength range, and a light within a third wavelength range define three color vertices of a color gamut characterizing the color converter.

6. The color converter of claim 1, wherein the color conversion layer comprises a plurality of pixels, wherein each of the plurality of pixels comprises from 1 to 5 sub-pixels.

7. The color converter of claim 1, wherein the color conversion layer is characterized by a PPI from 100 to 50,000.

8. The color converter of claim 1, wherein each sub-pixel of the first group of sub-pixels is characterized by an emission cone of less than 66°.

9. The color converter of claim 1, wherein each sub-pixel comprises a plurality of conversion enhancing particles.

10. The color converter of claim 1, wherein each sub-pixel comprises a binder.

11. The color converter of claim 1, wherein the first plurality of quantum dots comprises a spacing ligand.

12. The color converter of claim 1, wherein the first plurality of quantum dots comprises a reactive ligand.

13. The color converter of claim 12, wherein the reactive ligand is configured to chemically react with a binder, with a particle, with a side wall, with a complimentary reactive ligand, and/or with a ligand and/or coating of a quantum dot.

14. The color converter of claim 1, wherein each of the first group of sub-pixels and a second group of sub-pixels exhibits a color conversion efficiency greater than 70% when irradiated with light within a wavelength range from 405 nm to 475 nm; and the color purity is >90% corresponding to a transmission of a pump light through the sub-pixel of less than 10%.

15. The color converter of claim 1, wherein, when irradiated with blue light within a wavelength range from 405 nm to 475 nm, the first group of sub-pixels is capable of emitting in a green wavelength range from 515 nm to 565 nm; and a second group of sub-pixels is capable of emitting in a red wavelength range from 565 nm to 650 nm.

16. The color converter of claim 15, further comprising a structured layer overlying the color conversion layer, wherein the structured layer is configured to focus light emitted by the first group of sub-pixels.

17. The color converter of claim 1, wherein the first group of sub-pixels and a second group of sub-pixels are interleaved.

18. The color converter of claim 1, further comprising a passivation layer underlying the color conversion layer and/or overlying the color conversion layer.

19. The color converter of claim 1, further comprising a selective wavelength reflective layer underlying the color conversion layer and/or overlying the color conversion layer.

20. The color converter of claim 1, further comprising an optical decoupling layer underlying the color conversion layer.

21. An optical display comprising:
a light emitting diode array; and
the color converter of claim 1 overlying and optically coupled to the light emitting diode array.

22. The optical display of claim 21, comprising a circuit layer underlying and electrically interconnected to the light emitting diode array.

23. An electronic device comprising the optical display of claim 21.

24. A method of making a color conversion layer comprising:
depositing an aluminum layer on a substrate to define a plurality of cavities;
depositing a first color conversion material into a first portion of the plurality of cavities, wherein the first color conversion material comprises a first plurality of quantum dots; and
depositing a second color conversion material into a second portion of the plurality of cavities, wherein the second color conversion material comprises a second plurality of quantum dots;
wherein each of the plurality of cavities comprises:
a volume less than 30 µm³;
a depth from 1 µm to 3 µm;
a pitch less than 5 µm; and
a density of the quantum dots within the volume from 10 vol % to 50 vol %,
wherein vol % is based on the total volume of a cavity.

25. The method of claim 24, further comprising depositing a color transmitting material into a third portion of the plurality of cavities, to provide three color vertices of a color gamut characterizing a color converter.

26. The method of claim 24, further comprising, after depositing the second color conversion material, initiating a polymerization reaction.

27. The method of claim 24, wherein depositing the first color conversion material comprises depositing by gel permeation.

28. The method of claim 24, wherein depositing comprises applying an ink comprising a plurality of quantum dots into the cavities.

29. The method of claim 24, wherein depositing comprises depositing a free-flowing composition comprising quantum dots into the cavities.

30. A color converter made by the method of claim 24.

31. A display comprising the color converter of claim 30.

* * * * *